(12) United States Patent
Kuo

(10) Patent No.: US 7,635,881 B2
(45) Date of Patent: Dec. 22, 2009

(54) CONTINUOUS MULTIGATE TRANSISTORS

(76) Inventor: Jack Kuo, 3F, No. 38, Lane 218, Nanya Street, Hsinchu (TW)

( * ) Notice: Subject to any disclaimer, the term of this patent is extended or adjusted under 35 U.S.C. 154(b) by 0 days.

(21) Appl. No.: 12/039,082

(22) Filed: Feb. 28, 2008

(65) Prior Publication Data

US 2009/0194822 A1    Aug. 6, 2009

(30) Foreign Application Priority Data

Feb. 4, 2008    (TW) .............................. 97104263 A

(51) Int. Cl.
*H01L 29/80*    (2006.01)

(52) U.S. Cl. ................ 257/270; 257/365; 257/E29.264

(58) Field of Classification Search ................ 257/206, 257/270, 365, 392, E29.264
See application file for complete search history.

(56) References Cited

U.S. PATENT DOCUMENTS 6,747,328 B2 *    6/2004    Wu ............................ 257/412
2008/0128767 A1 *    6/2008    Adkisson et al. ............ 257/292

* cited by examiner

*Primary Examiner*—Quoc D Hoang
(74) *Attorney, Agent, or Firm*—Lowe Hauptman Ham & Berner LLP

(57) ABSTRACT

An N doped area neighboring to a P doped area on a semiconductor material, function respectively as a first gate and a second gate for transistors. A dielectric layer is made under the gates. A source and a drain are made under and near two sides of the dielectric layer, electrically coupled to the gate to form continuous multigate transistors.

14 Claims, 6 Drawing Sheets

CONTINUOUS MULTIGATE TRANSISTORS

RELATED APPLICATIONS

The present application is based on, and claims priority date from Taiwan Application Serial Number 097104263, filed Feb. 4, 2008, the entire disclosure of which is incorporated by reference herein.

FIELD OF THE INVENTION

This disclosure relates to transistors, especially to continuous multigate transistors having adjacent poly gates with different dopant. The multigate transistors can be used in integrated circuits, and memories such as read only memory (ROM), nonvolatile memory, dynamic random access memory (DRAM), and static random access memory (SRAM).

BACKGROUND

FIG. 1 Prior Art—Traditional Transistors in Parallel Connection

FIG. 1 shows traditional transistors in parallel connection, the first transistor T1 with a first Gate G1; the dielectric layer 11 is made under the first gate G1. The dielectric layer 11 has two ends; a source S and a drain D are made under the dielectric layer 11, each near one of the two ends of the first dielectric layer 11. A second transistor T2 with a second Gate G2, is in parallel to and spaced apart from the first gate G1; a dielectric layer 12 is made under the second gate G2. The dielectric layer 12 has two ends; the common source S and the common drain D are extended under the dielectric layer 12, each near one of the two ends of the dielectric layer 12. There is semiconductor material 13 between the common source S and the common drain D.

The two transistors T1, T2 in parallel connection according to the traditional structure are with the same device structure, and having a similar threshold voltage (Vt). The two gates G1, and G2 are made of the same semiconductor material and doped with a same dopant. A unit length L exists between them to form two transistors in parallel connection. The minimum length in Y direction for the traditional transistors in parallel connection is of three unit lengths (3 L). A unit length L is a minimum width of a design rule used in the manufacturing process for such transistors.

Nowadays, a typical memory chip has $10^8 \sim 10^{10}$ transistors made thereon in a single chip. With the technology progress, the number of transistor in a single chip is increasing progressively. As the number of transistor increases for a single chip, the semiconductor material used for a memory chip is therefore increasing. It is desirable to reduce the occupied chip area for a single memory chip on a piece of wafer, while with a same number of transistors on a single memory chip. This not only increases yield for a semiconductor wafer but also meets the requirement of light weight and miniaturization for a memory chip.

FIG. 2 Prior Art—Traditional Transistors in Series Connection

FIG. 2 shows traditional transistors in series connection, the first transistor T21 with a first Gate G21. A dielectric layer 21 is made under the first transistor T21. A source S is made under and on the left side of the dielectric layer 21. A drain/source DS is made under and on the right side of the dielectric layer 21. A second transistor T22 with a second Gate G22 is neighboring to the first transistor T21. A dielectric layer 22 is made under the second gate G22. The drain/source DS functions as a source for the second transistor T22. A drain D is made under and on the right side of the dielectric layer 22. There is semiconductor material 23 in between the drains D and the sources S. The first gate G21 and the second G22 are spaced by a unit length (L). A unit length L is a minimum width of a design rule used in the manufacturing process for such transistors.

The two transistors T21, T22 in series connection according to the traditional structure are with a same device structure, and having a similar threshold voltage (Vt). The two gates G21, G22 are made of the same semiconductor material and doped with a same dopant. A unit length L exists between them to form two transistors in series connection. The minimum distance in X direction is of five unit lengths (5 L). A unit length L is a minimum width of a design rule used in the manufacturing process for such transistors.

DETAILED DESCRIPTION

This invention discloses a design for transistors which saves half area of semiconductor material comparing with traditional ones, while with a same number of transistors in a single memory chip. This invention is realized to implant a first area of a semiconductor material with a first dopant, and to implant a second area on the same semiconductor material, adjacent and continuous to the first area, with a second dopant complementary to the first dopant. The two areas are the first and second gate in the transistor. With this technology applied in memory device, one can save half area of semiconductor than the traditional one.

Figure 3:
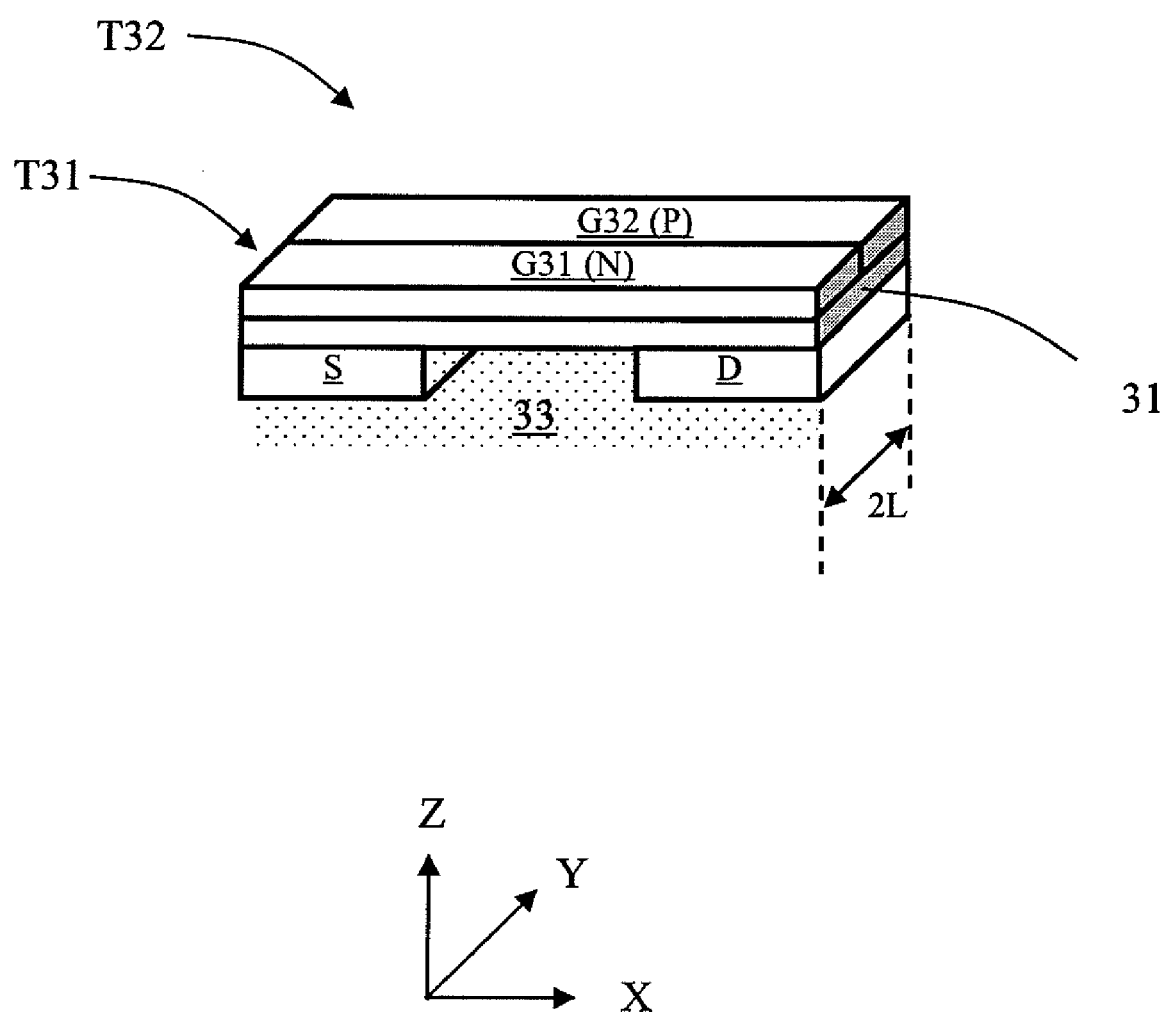

FIG. 3 Shows a First Embodiment—Continuous Multigate Transistors in Parallel Connection A first transistor T31 has a first Gate G31(N) made of semiconductor material and doped with a first dopant, e.g. N type dopant. A dielectric layer 31 is made under the first gate G31. The dielectric layer 31 has a first end (i.e. left side of the figure) and a second end (i.e. right side of the figure). A source S is made under and on the left side of the dielectric layer 31. A drain D is made under and on the right side of the dielectric layer 31. A second transistor T32 has a second Gate G32(P) made of semiconductor material and doped with a second dopant (e.g. a P type dopant) which is complementary to the first dopant, abuts against the first gate G31. The dielectric layer 31 extends under the second gate G32. The dielectric layer 31 has a first end (i.e. left side of the figure) and a second end (i.e. right side of the figure). The source S extends under the dielectric layer 31 to become a source of the second transistor T32. The drain D extends under the dielectric layer 31 to become a drain of the second transistor T32. In other words, the two transistors T31 and T32 share a common source S, and share a common drain D. There is semiconductor material 33 between the common source S and the common drain D.

Figure 1:
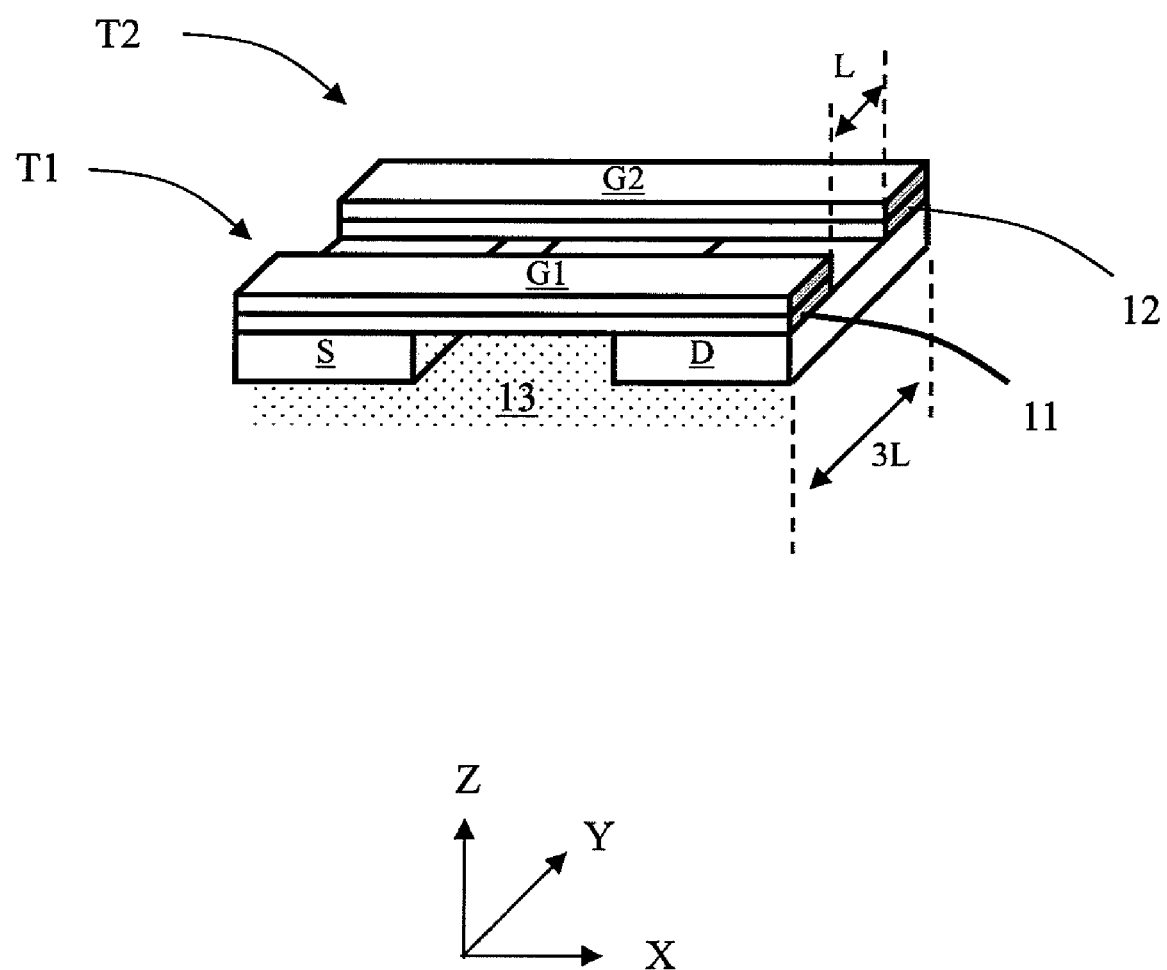
FIG. 1. shows a prior art—parallel connection
FIG. 2. shows a prior art—series connection
FIG. 3. shows a first embodiment—parallel connection
FIG. 4. shows a second embodiment—series connection

The two transistors T31, T32 are made to be in parallel connection. The adjacent transistors are made side by side and with gates doped with different dopant. Furthermore, the adjacent transistors have different threshold voltage (Vt) from each other. A length of 2 L for the adjacent transistor in Y direction is only two-third (⅔) of that for the traditional transistors in parallel connection as shown in FIG. 1. ⅔ is calculated from the comparison of the corresponding lengths 2 L v. 3 L, and then 2 L/3 L=⅔.

When the number of transistor is extremely large to be made on a single chip, the occupied area of a single chip on the semiconductor wafer saves half. The occupied area for a single chip according to this embodiment and compared with a traditional one as shown in FIG. 1 is as follows:

The length for traditional transistors in parallel connection is: (2n−1)L. However, the length for continuous multigate transistors in parallel connection is: nL Wherein, n is the number of transistors.

L is a unit length of a design rule for a transistor.

(2n−1)L is simplified to be 2 nL when n is extremely a large number.

(Length for traditional transistors in parallel)/

(Length for continuous multigate transitors in parallel) =

$$(2n-1)L/nL \sim 2nL/nL = 2$$

The adjacent transistors T31, T32 have an adjacent gates G31, G32. PN junction is formed between the adjacent gates G31, G32. For the independent operation for the adjacent transistors, and avoiding the current flow interference between the PN junction, the adjacent transistors are designed with different threshold voltages. In the embodiment as shown in FIG. 3, the first transistor T31 is made to be with a first threshold voltage Vt31 which is higher than the threshold voltage Vt32 of the second transistors T32. e.g. Vt31=$V_{DD}$/2+Vt32. Thereafter, the PN junction will never be turned on during normal operation.

A typical operation parameters can be described as follows:

T31 is at high state when the gate G31 is applied with a voltage of $V_{DD}$, and T31 is at low state when the gate G31 is applied with a voltage of $V_{DD}$/2. In the meanwhile, T32 is at high state when the gate G32 is applied with a voltage of $V_{DD}$/2, and T32 is at low state when the gate G32 is applied with a voltage of 0V. The states for transistors T31, T32 are summarized as follows:

|  | Transistor T31 with Gate G31 | Transistor T32 with Gate G32 |
| --- | --- | --- |
| High | $V_{DD}$ | $V_{DD}$/2 |
| Low | $V_{DD}$/2 | 0 V |

Figure 4:
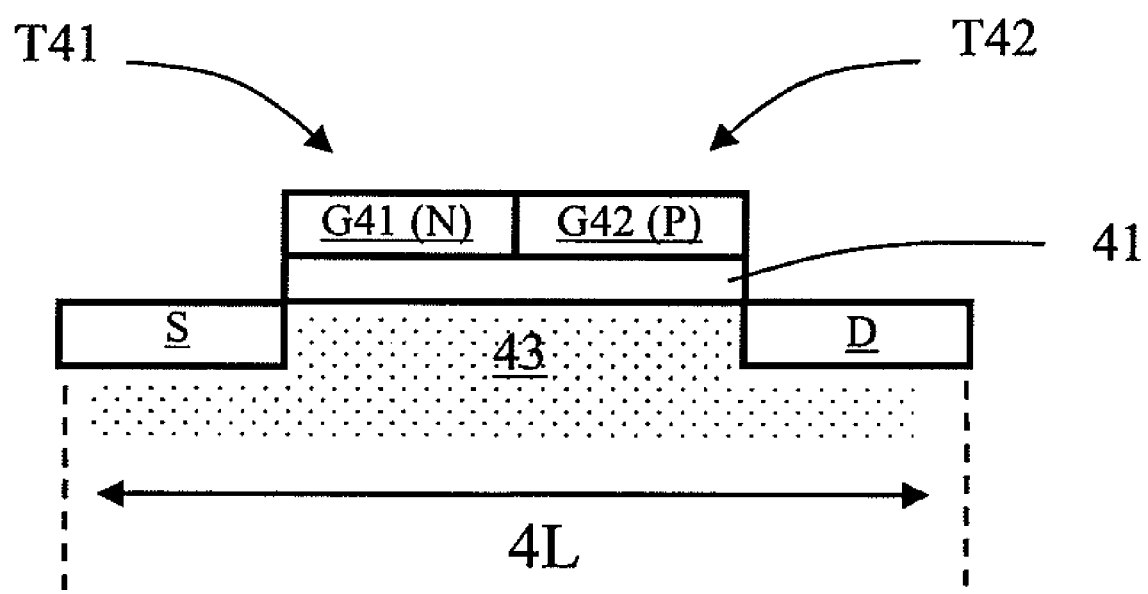
Figure 4:
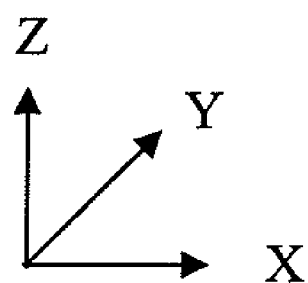

FIG. 4 Shows a First Embodiment—Continuous Multigate Transistors in Series Connection The continuous multigate transistors in series connection as shown in FIG. 4, comprises:

A first gate G41(N) made of semiconductor material and doped with a first dopant, e.g. N type dopant; a second gate G42(P), adjacent to the first gate G41(N), made of semiconductor material and doped with a second dopant, e.g. P type dopant. A dielectric layer 41 is made under the first gate G41(N) and the second gate G42(P). The dielectric layer 41 has a first end (i.e. left side of the figure) and a second end (i.e. right side of the figure). A source S is made under and on the left side of the dielectric layer 41. A drain D is made under and on the right side of the dielectric layer 41. There is semiconductor material 43 between the source S and the drain D.

Figure 2:
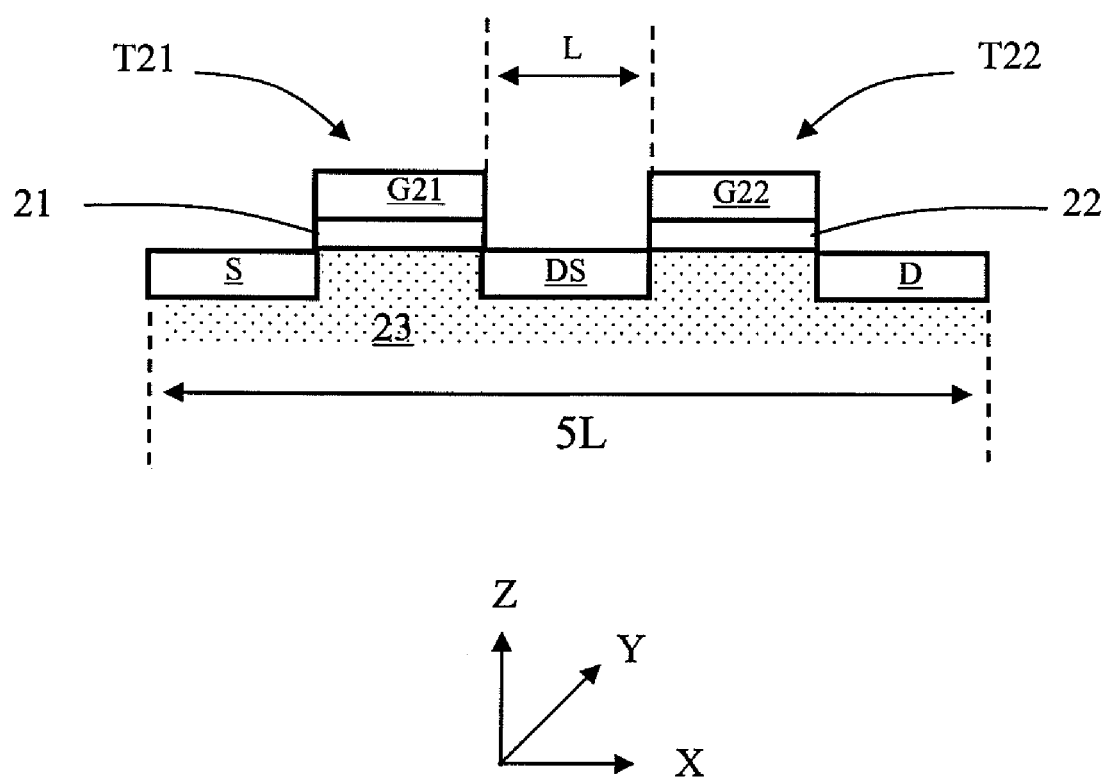

The adjacent transistors T41, T42 are made side by side and with gates doped with different dopant. Furthermore, the adjacent transistors have different threshold voltage (Vt) from each other. A length of 4 L for the adjacent transistor in X direction is only four-fifth (⅘) of that for the traditional transistors in parallel connection as shown in FIG. 2. ⅘ is calculated from comparison of the corresponding lengths 4 L v. 5 L, and then, 4 L/5 L=⅘.

When the number of transistor is extremely large to be made on a single chip, the occupied area of a single chip on the semiconductor wafer saves half. The occupied area for a single chip according to this embodiment and compared with a traditional one as shown in FIG. 2 is as follows:

The length in X direction for traditional transistors in series connection is: (2n+1)L. However, the length in X direction for continuous multigate transistors in series connection is: (n+2)L Wherein, n is the number of transistors.

L is a unit length of a design rule for a transistor.

(2n+1)L is simplified to be 2 nL when n is extremely a large number.

(n+2)L is simplified to be nL when n is extremely a large number.

(Length for traditional transistors in series)/

(Length for continuous multigate transitors in series) =

$$(2n+1)L/(n+2)L \sim 2nL/nL = 2$$

The threshold voltages setting are the same as that described for FIG. 3 as an example. A typical operation parameters can be described as follows:

T41 is at high state when the gate G41 is applied with a voltage of $V_{DD}$, and T41 is at low state when the gate G41 is applied with a voltage of $V_{DD}$/2. In the meanwhile, T42 is at high state when the gate G42 is applied with a voltage of $V_{DD}$/2, and T42 is at low state when the gate G42 is applied with a voltage of 0V. The states for transistors T41, T42 are summarized as follows:

|  | Transistor T41 with Gate G41 | Transistor T42 with Gate G42 |
| --- | --- | --- |
| High | $V_{DD}$ | $V_{DD}$/2 |
| Low | $V_{DD}$/2 | 0 V |

Figure 5A:
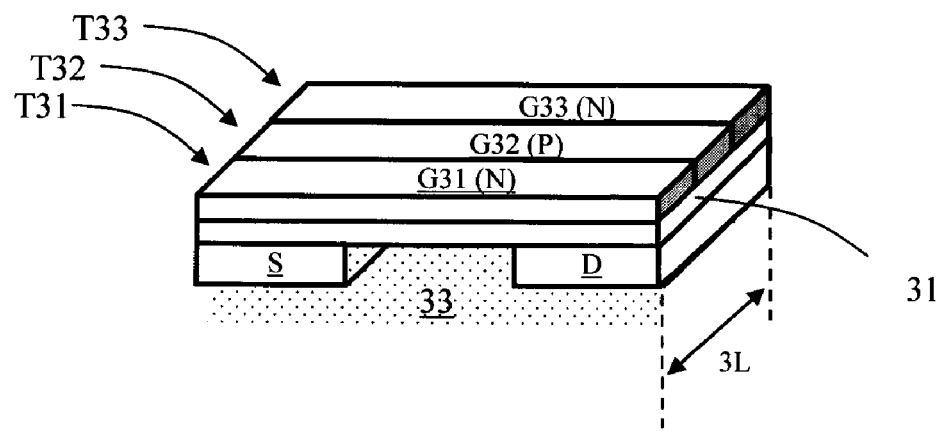
FIG. 5A shows an additional transistor added to the embodiment illustrated in FIG. 3

FIG. 5A. illustrates an embodiment wherein an additional transistor added with respect to the embodiment illustrated in FIG. 3. In this embodiment a third transistor T33 is added after transistor T32, the transistor T33has a gate G33 doped with N dopant. The dimension in Y direction for three paralleled transistors of the present invention is 3 L.

Figure 5B:
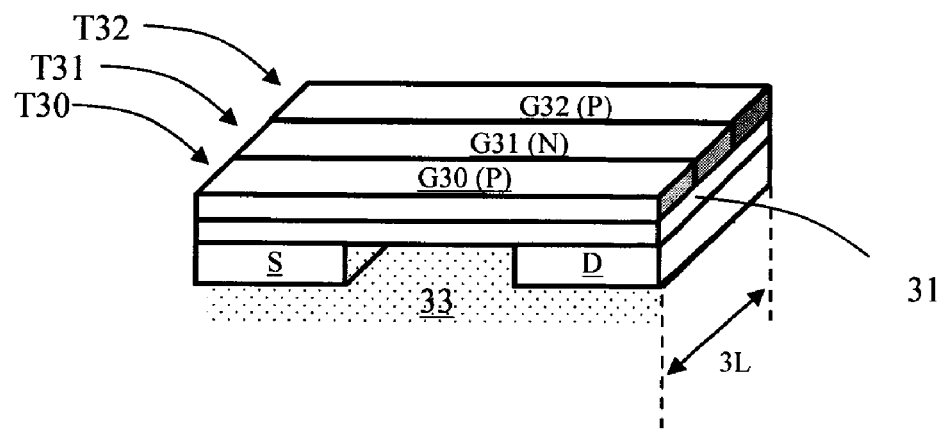
FIG. 5B shows an additional transistor added to the embodiment illustrated in FIG. 3

FIG. 5B. illustrates an embodiment wherein an additional transistor being added with respect to the embodiment illustrated in FIG. 3. In this embodiment, a third transistor T30 is added before transistor T31, the transistor T30 has a gate G30 doped with P dopant. The dimension in Y direction for three paralleled transistors of the present invention is 3 L.

Figure 6A:
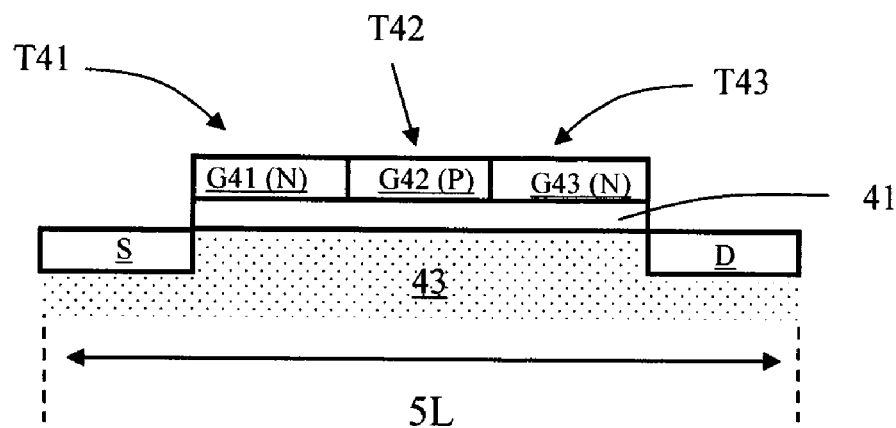
FIG. 6A shows an additional transistor added to the embodiment illustrated in FIG. 4

FIG. 6A. illustrates an embodiment wherein an additional transistor being added with respect to the embodiment illustrated in FIG. 4. In this embodiment a third transistor T43 is added to the right of transistor T42, the transistor T43 has a gate G43 doped with N dopant. The dimension in X direction for three continuous serial transistors of the present invention is 5 L.

Figure 6B:
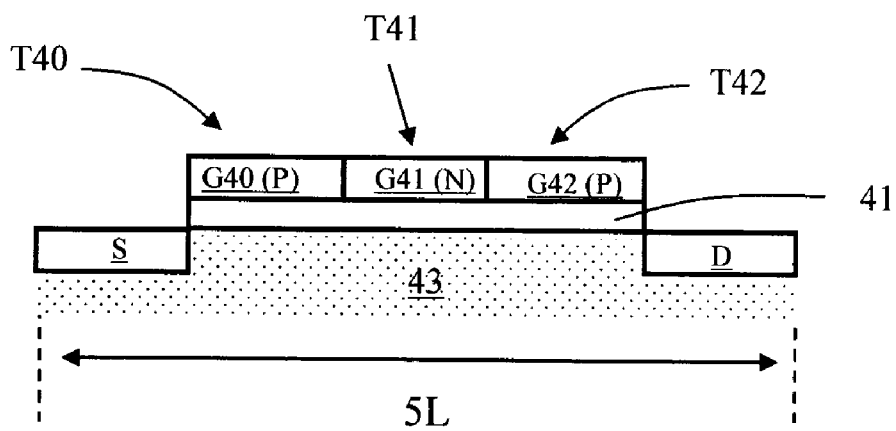
FIG. 6B shows an additional transistor added to the embodiment illustrated in FIG. 4

FIG. 6B. illustrates an embodiment wherein an additional transistor being added with respect to the embodiment illustrated in FIG. 4. In this embodiment a third transistor T40 is added to the right of transistor T41, the transistor T40 has a gate G40 doped with P dopant. The dimension in X direction for three continuous serial transistors of the present invention is 5 L.

While the preferred several embodiments have been described by way of example, it will be apparent to those skilled in the art that various modifications may be made in the embodiments without departing from the spirit of the present invention. Such modifications are all within the scope of the present invention, as defined by the appended claims.

What is claimed is:

1. Continuous multigate transistors, comprising:
    a first gate, elongate in a first direction, and made of semiconductor material and doped by a first dopant;
    a second gate, elongate in the first direction, immediately adjacent to said first gate, and made of semiconductor material and doped by a second dopant.
    a single dielectric layer, being made under the gates;
    a source, extended in a direction normal to the first direction of said gates, made under said dielectric layer, and configured under a first end of said gates; and
    a drain, extended in a direction normal to the first direction said gates, made under said dielectric layer, and configured under a second end of said gates, wherein the first dopant is N-type and the second dopant is P-type, and wherein said N type gate has a threshold voltage higher than a threshold voltage of P type gate.

2. The continuous multigate transistors as claimed in claim 1, wherein the number of gates is two.

3. The continuous multigate transistors as claimed in claim 1, wherein the number of gates is more than two.

4. The continuous multigate transistors as claimed in claim 3, wherein said number of gates is three and each of said gates is sequentially doped by N type, P type, and N type dopant.

5. The continuous multigate transistors as claimed in claim 3, wherein said number of gates is three and each of said gates is sequentially doped by P type, N type, and P type dopant.

6. The continuous multigate transistors as claimed in claim 1, wherein said source and drain are disposed completely below the single dielectric layer.

7. The continuous multigate transistors as claimed in claim 1, wherein each gate of continuous multigate transistors is independently operable from the other.

8. Continuous multigate transistors, comprising:
    an N gate, being made of semiconductor material and doped by N type dopant; having a Vt;
    a P gate, adjacent to said N gate, being made of semiconductor material and doped by P type dopant; having a Vt which is lower than said Vt of said N gate;
    a dielectric layer, being made under the gates;
    a source, being made under said dielectric layer, and configured under a first end of said N gate; and
    a drain, being made under said dielectric layer, and configured under a second end of said P gates.

9. The continuous multigate transistors as claimed in claim 8, wherein a number of said gates is two.

10. The continuous multigate transistors as claimed in claim 8, wherein a number of gates is more than two.

11. The continuous multigate transistors as claimed in claim 10, wherein said number of gates is three and each of said gates is sequentially doped by N type, P type, and N type dopant.

12. The continuous multigate transistors as claimed in claim 10, wherein said number of gates is three and each of said gates is sequentially doped by P type, N type, and P type dopant.

13. The continuous multigate transistors as claimed in claim 8, wherein said source and drain are disposed completely below the single dielectric layer.

14. The continuous multigate transistors as claimed in claim 8, wherein each gate of continuous multigate transistors is independently operable from the other.

* * * * *